United States Patent [19]

Wright

[11] Patent Number: 4,477,134

[45] Date of Patent: Oct. 16, 1984

[54] ELECTROSTATIC DISCHARGE PROTECTED INTEGRATED CIRCUIT MODULE

[75] Inventor: Allen J. Wright, Corvallis, Oreg.

[73] Assignee: Hewlett-Packard Company, Palo Alto, Calif.

[21] Appl. No.: 576,788

[22] Filed: Feb. 6, 1984

Related U.S. Application Data

[63] Continuation of Ser. No. 293,036, Aug. 14, 1981, abandoned.

[51] Int. Cl.³ .................. H01R 23/66; H01R 23/70
[52] U.S. Cl. .................. 339/17 F; 200/51.1
[58] Field of Search .......... 339/17 F, 17 L, 17 CF, 339/17 LM, 176 MF, 176 MP; 361/398; 200/51.09, 51.1

[56] References Cited

U.S. PATENT DOCUMENTS

| | | | |
|---|---|---|---|
| 3,307,139 | 2/1967 | Prise | 339/176 MF |
| 3,536,870 | 10/1970 | Izumi | 200/51.1 |
| 4,169,641 | 10/1979 | Olsson | 339/17 F |
| 4,211,459 | 7/1980 | Madden | 339/176 MF X |
| 4,348,071 | 9/1982 | Hsieh | 339/176 MF X |

Primary Examiner—Neil Abrams
Attorney, Agent, or Firm—Jon R. Stark

[57] ABSTRACT

An electrostatic discharge protected integrated circuit module is disclosed in which an integrated circuit is attached to a flexible circuit board inside a receptacle. Spring action forces the traces of the flexible circuit board against a conducting surface in the receptacle, shorting the traces so that the potential at all contact leads of the integrated circuit will rise uniformly in the event of an electrostatic discharge. A plug connector may be inserted through an opening in the receptacle to interrupt the shorting and to connect the integrated circuit to an electronic device. Protection is restored automatically when the plug connector is withdrawn.

6 Claims, 6 Drawing Figures

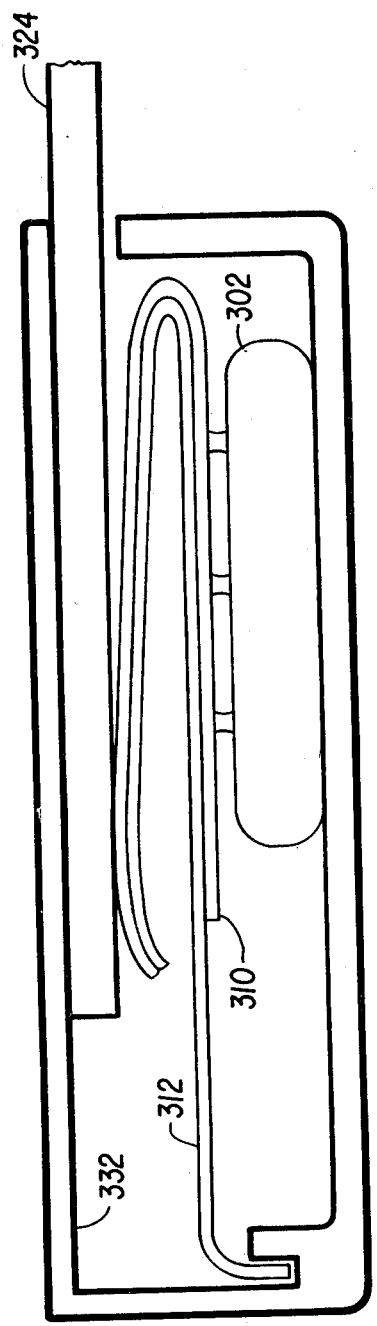
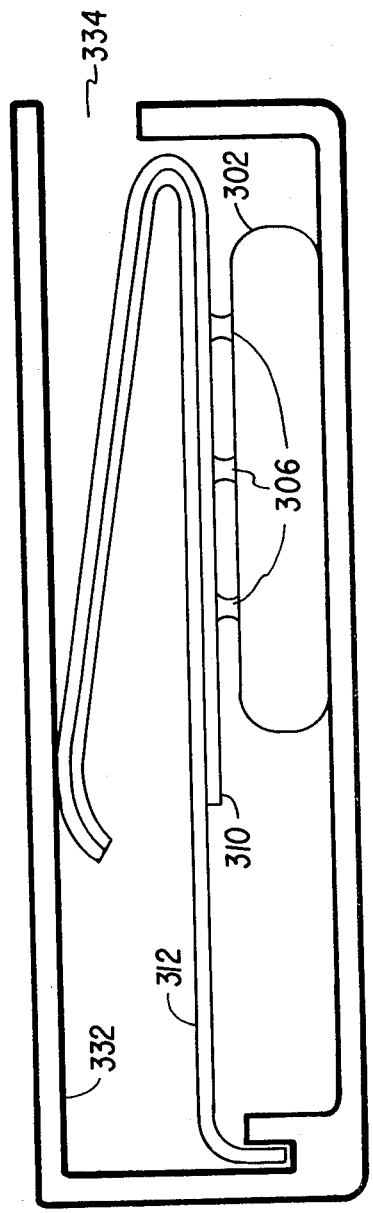

ELECTROSTATIC DISCHARGE PROTECTED INTEGRATED CIRCUIT MODULE

This is a continuation of application Ser. No. 293,036, filed Aug. 14, 1981, now abandoned.

BACKGROUND OF THE INVENTION

Many electronic devices, such as calculators, are designed to accept one or more plug-in integrated circuit modules to enhance the flexibility or the capacity of the device. One example is a calculator, disclosed in U.S. Pat. No. 4,063,221 of Watson, Walden, and Near, which accepts plug-in read-only memory modules. These modules allow the user to tailor the configuration of the calculator to meet the user's specific needs, by providing a range of mathematical and statistical capabilities appropriate to a given task.

Such modules, while functional, may not be entirely satisfactory in use because of susceptibility to damage from electrostatic discharges experienced in handling. Damage to an integrated circuit can result when an electrostatic discharge produces a differential voltage across the circuit "pins" or contact leads. High voltages can cause physical disruption within the circuit, while low voltages may alter the contents of stored memory.

SUMMARY OF THE INVENTIONS

In accordance with the preferred embodiments of the present invention, an integrated circuit module resists damage from electrostatic discharges by maintaining the same potential at all contact leads whenever the circuit is disconnected from the host device. Flexible circuitry within the module electrically shorts together all the contact leads on a conducting surface, so that electrostatic discharges will cause the potential to rise uniformly on all leads. Contact with the conducting surface is made by spring action, so that a plug-in connector on the host device may be inserted to flex the spring, separate the circuitry from the conducting surface, and simultaneously form the desired connections with the host device. When the plug connector is removed, the spring action automatically returns the circuitry to its original position, restoring static discharge protection.

BRIEF DESCRIPTION OF THE DRAWINGS

FIGS. 3a and 3b, respectively, are cross-sections of an electrostatic discharge protected integrated circuit module when disconnected and connected to a plug connector.

DESCRIPTION OF THE PREFERRED EMBODIMENTS

Figure 1:
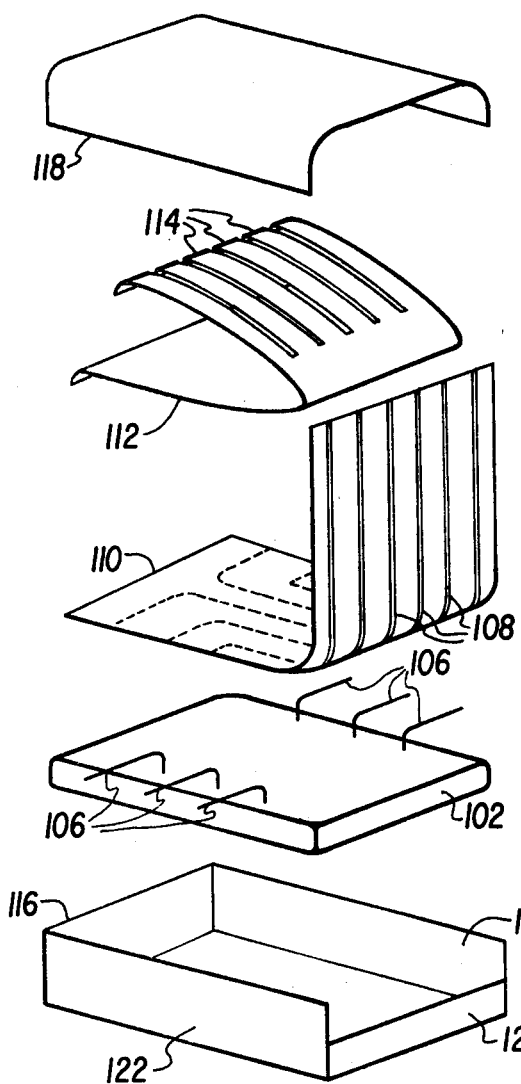
FIG. 1 is an exploded view of an electrostatic discharge protected integrated circuit module.

Referring now to FIG. 1, an integrated circuit 102 is to be used with an electronic device having a plug connector. For exemplary purposes, integrated circuit 102 may be a read-only or random access memory, while the electronic device may be a calculator designed to use any one of several such memories, depending on the calculations to be performed.

Integrated circuit 102 bears contact leads 106. The exact number of contact leads will, of course, vary with the design of integrated circuit 102; six leads are shown in FIG. 1 for clarity of presentation. In the preferred embodiments, contact leads 106 are soldered to conducting traces 108 of a flexible circuit board 110.

Flexible circuit board 110 is then preferably wrapped around a spring 112, so that traces 108 are to the outside, not in contact with the spring. Pressure sensitive adhesive may be used to attach flexible circuit board 110 to spring 112. In the preferred embodiments, spring 112 has separate tines 114 for exerting pressure against the individual traces 108.

In the preferred embodiments, a receptacle is formed by a case 116 and a cover 118. Integrated circuit 102, flexible circuit board 110, and spring 112 are placed in case 116, and then cover 118 may be snapped on. Case 116 may be molded plastic, while cover 118 is preferably made of metal. Other receptacle construction methods may be used, so long as a conducting surface, corresponding to the inner surface of cover 118, is provided for electrically shorting together traces 108. For example, the entire receptacle may be made of plastic with an inlaid metal band or a metal coated surface positioned on the inside of the receptacle above traces 108.

In the preferred embodiments, case 116 has a side 120 which is lower than adjacent sides 122. When cover 118 is placed over case 116, the reduced height of side 120 with respect to sides 122 will leave an opening between side 120 and cover 118, through which a plug connector may be inserted.

Figure 2:
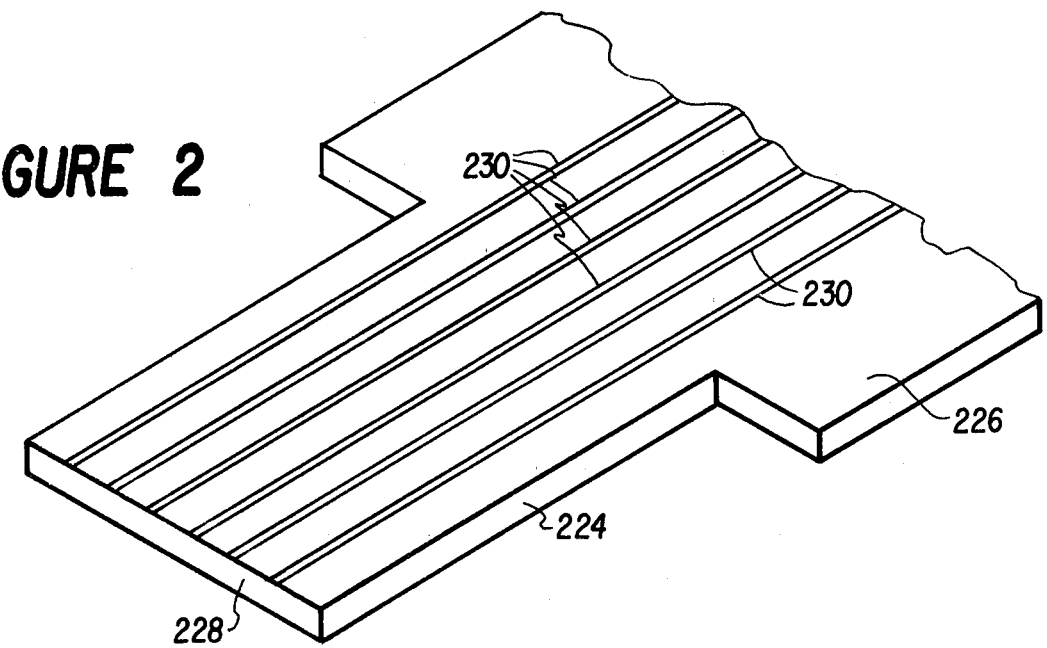
FIG. 2 shows a plug connector.

FIG. 2 illustrates a plug connector 224 suitable for use with the embodiment of FIG. 1. Portion 226 is provided for attachment to an electronic device designed to use an integrated circuit module, while end 228 is shaped to be inserted into the module. Plug connector 224 may be cut out from ordinary rigid circuit board material. Conducting traces 230 are placed to match the spacing of traces 108 of FIG. 1, so that connections may be made between the electronic device and the integrated circuit.

Operation of the preferred embodiments may be understood by reference to FIGS. 3a and 3b. In FIG. 3a, an integrated circuit 302 is connected to traces on flexible circuit board 310, which is pressed against conducting surface 332 by spring 312. In this manner, contact leads 306 are electrically shorted together so that any electrostatic discharge will cause the potential at leads 306 to rise uniformly, avoiding differential voltages and thus preventing damage to integrated circuit 302. An opening 334 permits a plug connector to be inserted to connect integrated circuit 302 to an electronic device.

In FIG. 3b, a plug connector 324 has been inserted, flexing spring 312. Contact between flexible circuit board 310 and conducting surface 332 is thus interrupted, while contact between conducting traces on the underside of plug connector 324 and traces on flexible circuit board 310 is established. In this manner, connection between integrated circuit 302 and an electronic device may be formed. If plug connector 324 is withdrawn, the spring 312 will resume the shape shown in FIG. 3a, restoring electrostatic discharge protection.

Figure 4:
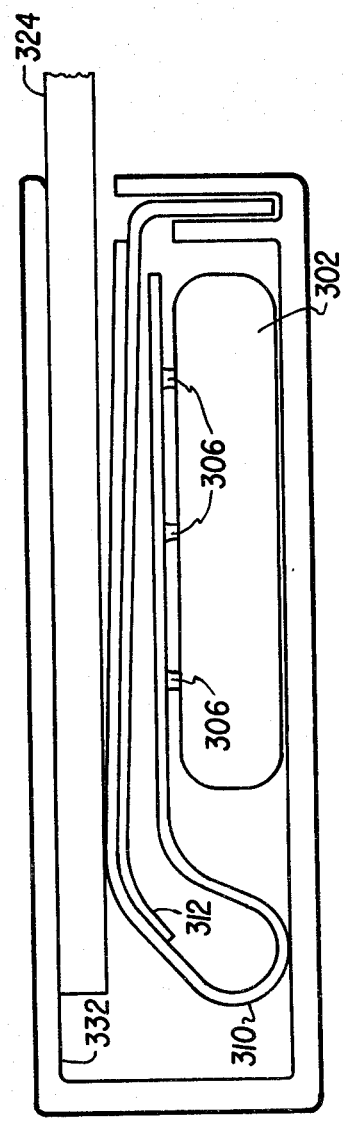
FIG. 4 is a cross-section of another electrostatic discharge protected integrated circuit module.
Figure 5:
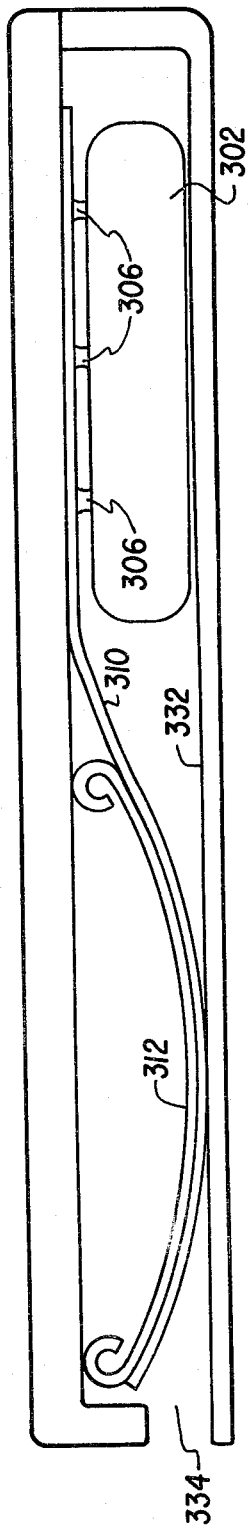
FIG. 5 is a cross-section of yet another electrostatic discharge protected integrated circuit module.

FIGS. 4 and 5 show alternative embodiments, which may be desirable if size or shape constraints must be considered in designing a module. References numerals in these figures indicate items which correspond to the same numbered items in FIGS. 3a and 3b. In FIG. 4, flexible circuit board 310 is wrapped around the free end of spring 312. In FIG. 5, spring 312 is placed between integrated circuit 302 and opening 334.

The preferred embodiments provide protection against damage from eletrostatic discharges which may be experienced in handling. Connection to an electronic device is easily made by the insertion of a plug connector, and protection is automatically resumed when the plug connector is removed.

I claim:

1. An electrostatic discharge protected integrated circuit module for use with an electronic device having a plug connector comprising:

an integrated circuit having contact leads;
   a receptacle containing the integrated circuit having an opening for receiving the plug connector of the electronic device;
   flexible circuit means within the receptacle for providing electrical connections to the integrated circuit, having conducting traces connected to the contact leads;
   a conducting surface in the receptacle for electrically shorting together the traces; and
   spring means in the receptacle for automatically urging the traces against the plug connector when the plug connector is inserted into the opening of the receptacle and for automatically urging the traces against the conducting surface when the plug connector is not inserted.

2. An electrostatic discharge protected integrated circuit module as in claim 1 wherein the spring means comprises a metal spring having a plurality of tines.

3. An electrostatic discharge protected integrated circuit module as in claim 1 wherein the integrated circuit is a read-only memory.

4. An electrostatic discharge protected integrated circuit module as in claim 1 wherein the integrated circuit is a random access memory.

5. An electrostatic discharge protected integrated circuit module as in claim 2 wherein the integrated circuit is a read-only memory.

6. An electrostatic discharge protected integrated circuit module as in claim 2 wherein the integrated circuit is a random-access memory.

* * * * *